Figure 1:
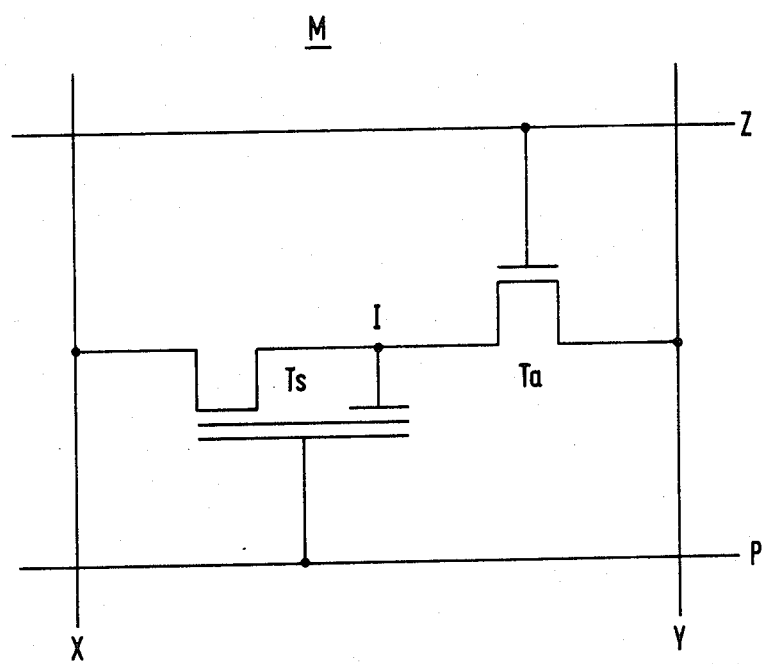

United States Patent [19]

Giebel

[11] Patent Number: 4,524,429
[45] Date of Patent: Jun. 18, 1985

[54] INTEGRATED MEMORY MATRIX COMPRISING NONVOLATILE REPROGRAMMABLE STORAGE CELLS

[75] Inventor: Burkhard Giebel, Denzlingen, Fed. Rep. of Germany

[73] Assignee: ITT Industries, Inc., New York, N.Y.

[21] Appl. No.: 472,349

[22] Filed: Mar. 4, 1983

[30] Foreign Application Priority Data

Mar. 24, 1982 [EP] European Pat. Off. ........ 82102447.8

[51] Int. Cl.³ .............................................. G11C 11/40
[52] U.S. Cl. ...................................... 365/154; 365/189
[58] Field of Search ......................... 365/154, 189, 230

[56] References Cited

U.S. PATENT DOCUMENTS 4,441,168  4/1984  Luciw ................................ 365/154
4,441,169  4/1984  Sasaki et al. ..................... 365/154

Primary Examiner—Terrell W. Fears
Attorney, Agent, or Firm—Donald J. Lenkszus

[57] ABSTRACT

The invention discloses an integrated memory matrix comprising nonvolatile reprogrammable storage (memory) cells arranged in rows and columns, as well as a classifying circuit integrated as well in the semiconductor body of the memory matrix, containing a nonprogrammable reference storage cell (Mr) of the same construction as that of the storage cells, and which is manufactured simultaneously as a comparison standard, with the storage cells. With the aid of a first voltage divider (Q1) integrated as well, whose output voltage is adjustable in steps, and whose output current is fed into the source-drain line of the reference storage cell (Mr) and/or of a second voltage divider (Q2) adjustable in steps and integrated as well, whose output voltage is applied to the control gate of the storage transistor (Ts) of the reference storage cell (Mr), it is possible to simulate a threshold voltage which is compared with the threshold voltages of the storage cells (M11 . . . Mmn) of the memory matrix (S) either individually or in groups with the aid of a comparator circuit (Ad) for obtaining a classifying criterion.

3 Claims, 2 Drawing Figures

INTEGRATED MEMORY MATRIX COMPRISING NONVOLATILE REPROGRAMMABLE STORAGE CELLS

In technical literature, programmable nonvolatile storage (memory) cells are known under various abbreviations mostly derived from English-language terms. Always there are concerned storage (memory) cells having insulated-gate field-effect transistor structures each comprising a storage medium. In the following specification the term "erase" refers to an operation in which, by the application of voltage to the electrodes of the cells, charges with the sign of the source and drain region are capable of reaching a storage medium lying above the channel area, and the term "write" refers to an operation in which these charges, likewise by the application of the voltages or else also by an ultraviolet radiation, are again removed from the storage medium. An overview of the involved storage (memory) cells is given in the article "Nonvolatile Semiconductor Memory Devices" as published on pages 1039 to 1040 in the technical journal "Proceedings of the IEEE", Vol. 64, No. 7 (July 1976).

The invention relates to an integrated memory matrix, i.e., to an array in which m×n storage cells are arranged in m columns and n rows. The storage or memory cells may consist alone of storage transistors, but may also additionally comprise a select transistor in the current path of the storage transistor, whose gate is connected to a select line as is known from pages 113 to 117 of the technical journal "Electronics" of Feb. 28, 1980.

In monitoring the manufacture of such memory matrices, as well as during final measurements there arises the problem of being able to classify the memory matrices in accordance with the threshold values of the cells, for which purpose, under normal conditions, all cells have to be successively picked out and tested.

It is the object of the invention to solve this classifying problem without involving any considerable additional investment in circuitry and time.

The invention is based on the idea of employing for this purpose, a reference cell of the same type which is integrated as well into the semiconductor body of the integrated memory matrix, i.e., a reference cell of the same construction which is manufactured simultaneously with the storage (memory) cells of the matrix in its semiconductor body.

The use of reference cells of the same type, integrated as well, with an integrated memory matrix of the type to which the invention relates, is already known from DE-OS No. 26 20 749. This matrix, however, is used to solve a problem differing from that on which the invention is based, namely the problem of unreliabilities owing to the variations of the read signals throughout long periods of time during read operations. In the prior art matrix, this problem is solved by providing at least one reference field-effect transistor having a variable threshold, which is adjusted to one threshold, with the reading device, each time upon interrogation of a storage transistor, interrogates the reference transistors, with this causing a reference signal to be produced, and by providing a comparator circuit comparing the storage signal with the reference read signal.

Accordingly, in starting out from the conventional memory matrix as disclosed in the above-mentioned piror art publication (DE-OS No. 26 20 749), the invention relates to an integrated memory matrix as set forth in the preamble of claim 1.

The already mentioned problem of classifying the integrated memory matrices either during or after the manufacture, is solved by the invention as set forth in the characterizing part of claim 1.

Preferably, both the first and the second source of voltage are voltage dividers built up from insulated-gate field-effect transistors, which are both integrated as well in the semiconductor body of the storage (memory) cell. The voltage dividers each comprise a base transistor as well as a number of parallel-arranged load transistors which are gradated in their width-to-length ratios of the channel regions. The load transistors are switched to the conducting state in accordance with the chosen voltage value.

In the following, the invention will now be explained with reference to a preferred example of embodiment shown in FIGS. 1 and 2 of the accompanying drawings, in which the integrated memory matrix is shown to contain reprogrammable storage cells M11 ... Mm1, M1n ... Mmn, which each contain a tunnel injector I which, with respect to a floating gate Fg, are effective in both current directions, as can be seen from FIG. 1. An integrated memory matrix employing such storage (memory) cells is known from the already mentioned technical journal "Electronics" of Feb. 28, 1980, pp. 113 to 117.

In the storage cell as shown in FIG. 1, the tunnel injector I is connected, on the one hand, via the source-drain line of a storage transistor Ts, to a first bit line X and, on the other hand, via the source-drain line of a select transistor Ta to a second bit line Y. Whereas the gate of the storage transistor Ts is connected to a programming line P, the gate of the select transistor Ta is connected to a select line Z which is connected to one of the outputs of a row decoder Dz serving the row-wise selection of the storage cells of the memory matrix.

Figure 2:
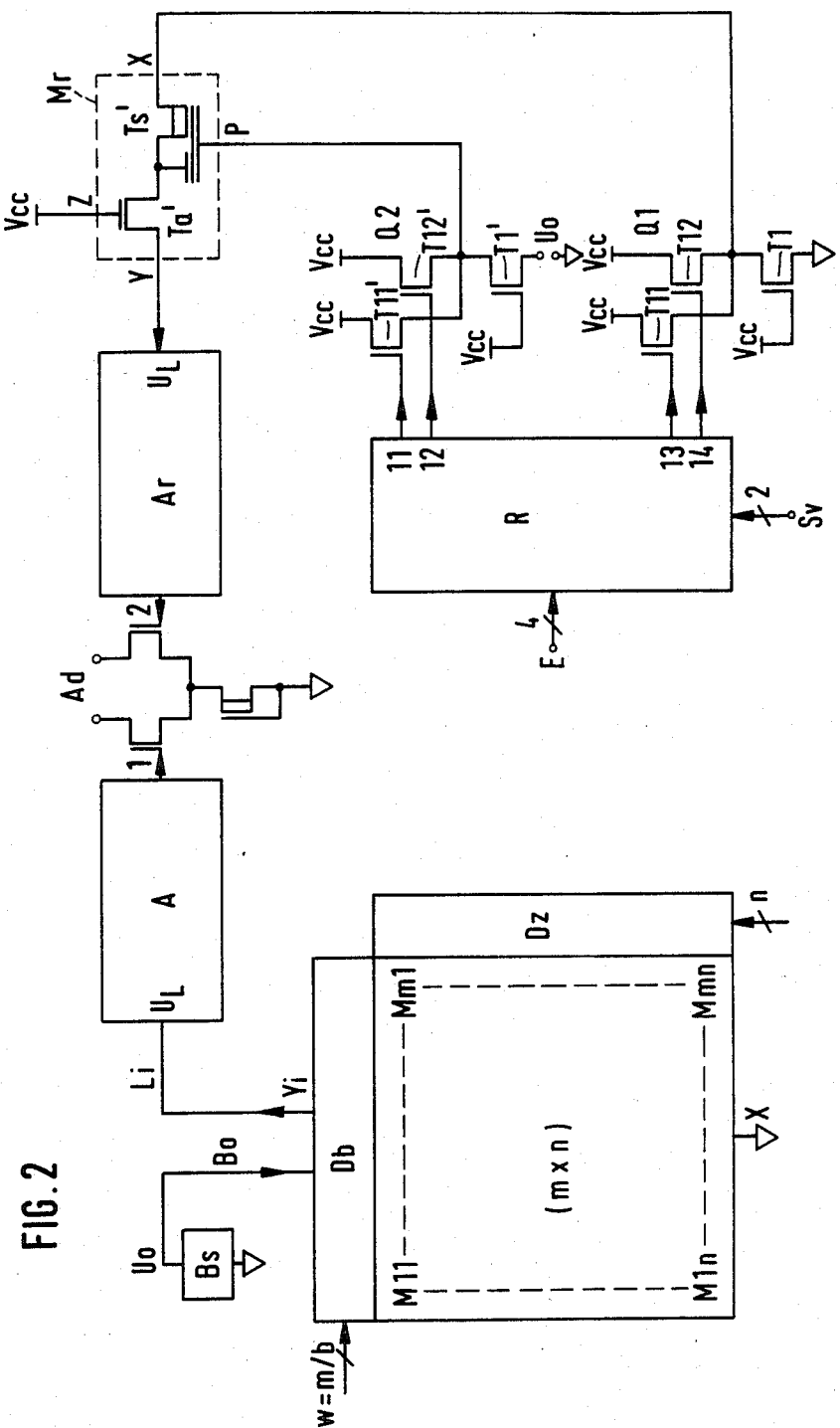

Apart from the row decoder Dz, as can be seen from the block diagram of FIG. 2, the peripheral circuit of the memory matrix S still contains the block decoder Db with the aid of which one of w=m/b blocks of n storage groups arranged in the column direction, can be selected. During the read operation, the first bit lines X are connected to the zero point of the circuit, as is shown in FIG. 2.

For selecting the i-st storage cell, the respective row thereof is selected by means of the row decoder Dz, and the respective block thereof is selected by the block decoder Db. Accordingly, each of the b storage cells can be reached via one of the b data lines Li of which, for the sake of clarity, however, there is only considered the i-st one. When selecting the address of a i-st cell, the read voltage $U_L$ will become effective thereon, so that a source-drain current corresponding to the respective information content will flow through the storage transistor thereof. Accordingly, and by means of a read amplifier, there is derived from this current a first voltage signal which is applied to the first input 1 of a comparator circuit Ad designed in the form of a differential amplifier. As a comparator circuit there may also be used a bistable multivibrator, as is known from the aforementioned DE-OS No. 26 20 749.

The second input 2 of the comparator circuit Ad is connected to the output of a reference read amplifier Ar resembling the read amplifier A. The input thereof supplies the read voltage $U_L$ of the same magnitude as that of the input of the read amplifier A. According to the invention, within the input circuit of the reference read amplifier Ar, there is arranged the source-drain line of the storage transistor Ts' of a nonprogrammed reference cell Mr which is identical to the storage cells of the memory matrix S, and manufactured simultaneously therewith.

By the use of the reference cell Mr there is given a calibrated reference voltage source which is equal to the limiting value of the threshold voltage of a programmed storage cell of the same type of cell, which the threshold voltage of a self-discharging, programmed storage cell asymptotically approaches as a function of time.

If, for example, a n-channel storage cell comprising a potentially floating storage gate, by removing the electrons from the storage gate, is set to the logic "one", then the threshold voltage is lowered with respect to the reference row Mr by a certain amount which can then be used as a quality criterium. Maximum values of the threshold voltage window, however, are reached relatively seldom, and are mostly also not necessary in connection with practical use. For the test operation, however, and for serving at first as an evaluating limit, there must be provided a threshold voltage between the cell serving as the written cell and the "virgin" cell serving as the reference cell Mr. This is accomplished by applying to the reference cell potentials other than the potentials reaching the storage cells M, in the course of which a threshold voltage is simulated which is utilized as an evaluating limit. For this purpose, the reference cell Mr is supplied with potentials other than those reaching the storage cells. In this way it is possible to obtain effects almost resembling the variations of the potentials controlling the storage cells.

For this purpose, in the input circuit of the reference read amplifier Ar in which the source-drain line of the storage transistor Ts' of the reference cell Mr lies, there is arranged a first voltage source Q1 whose voltage is adjustable in a step-by-step manner. Moreover, the gate electrode of the storage transistor Ts' of the reference cell Mr is connected to the one terminal of a step-by-step adjustable second voltage source Q2. If, for example, to the P-terminal of an n-channel reference cell, there is applied a more positive potential, there is achieved a lowering of the evaluation limit, owing to the apparent displacement of the threshold voltage $U_d$ toward more negative values, and vice versa upon application of a more negative signal. Furthermore, by applying a more positive potential to the X-terminal of the reference cell there is simulated a rise of the threshold voltage $U_d$, thus raising the evaluating limit. A lowering of the evaluating limit results from the application of a more negative potential to the X terminal. The two voltage sources Y1 and Y2 whose output voltage is adjustable in a step-by-step manner, are likewise integrated as well into the semiconductor body of the memory matrix.

Preferably, these two voltage dividers Y1 and Y2, as can be seen from FIG. 2, are designed in the form of voltage dividers consisting of insulated-gate field-effect transistors. Each of the voltage dividers contains a base transistor T1 or T1' respectively, with the source electrodes thereof being connected to ground potential and with the gate electrodes thereof being connected to a fixed potential, such as to the supply voltage Vcc. To the drain zone of each of the base transistors T1 or T1', there are connected the source electrodes of a plurality of load transistors T11, T12; T11', T12' respectively, which are gradated in their widths-to-length ratios W/L of the channel regions. Since, to the control gate of the storage transistor of a selected storage cell M of the memory matrix there is applied the block signal Uo of the block signal source Bs via the block line Bo, the source electrode of the base transistor T1' of the second voltage source. Q2 is likewise applied to the potential Uo serving as the reference voltage.

When employing each time two load transistors T11 and T12 or T11' and T12' in the two voltage sources Q1 or Q2 respectively, there will result the possiblity of simulating 16 threshold values of the storage transistor Ts' in the reference cell Mr. For the purpose of selecting a threshold value of the reference cell Mr there is provided a register R having four outputs 11, 12, 13, 14 which, as is shown in FIG. 2, are each connected to one gate of the individual load transistors T11, T12, T11', T12'. Moreover, and in accordance with the aforementioned 16 possibilities, the register comprises four register inputs E via which each time one static register assigned to an output, is capable of being ajusted. Upon selecting the simulated threshold value by the input of a corresponding byte via the register input E, the register is locked by applying a locking pulse to the locking input Sv.

When the logic "1" is assigned to the erased state of the storage cells, and when by the term "erase" there is understood the more negative charging of the storage gate with an n-channel storage transistor, then it is possible, by way of a simulated relatively high threshold value of the storage transistor, to give the reference cell Mr an evaluating limit relating to the one "quality" of the logic "1", and by way of simulating a relatively low threshold value of the storage transistor Ts', to give the reference cell Mr the other "quality" of the logic "0". If now differential amplifiers are provided in accordance with the number of bits b of the storage groups b, to the first inputs of which each time one data line of a storage cell of the respective selected storage group is connected, and to the second inputs of which there is applied a signal corresponding to a "simulated" threshold value of the reference cell, it is possible to check in any arbitrary order of sequence all of the groups in a groupwise manner with respect to the qualities of the logic "1" and also with respect to those of the logic "0", i.e., in that one such simulated threshold value pair is given by means of the register R, which is characteristic of the quality of the integrated memory matrix.

As can be easily seen from FIG. 2 and the foregoing specification, the investment in circuitry in the integrated memory matrix according to the invention for practically realizing a test-read operation is small compared to the effect, and can be so designed as not to affect the address-access time.

I claim:

1. Integrated memory matrix comprising nonvolatile reprogrammable storage (memory) cells arranged in rows and columns, which are each provided with a storage transistor (Ts) from the source-drain current of which, upon selecting the address of the storage cell (M) of the storage transistor (Ts), there is derived a first voltage signal which is applied to the one input of a comparator circuit, whereas from the source-drain current of an identical reference storage transistor of like construction with respect to said storage transistor (Ts) there is derived a second voltage signal which is applied to the other input of said comparator circuit, characterized by the following features:

the first input (1) of said comparator circuit (Ad) is connected to the output of a first read amplifier, with the source-drain current of said storage transistor (Ts) of said storage cell (M) flowing in the input circuit thereof, to the second input (2) of said comparator circuit (Ad) there is connected the output of a reference read amplifier (Ar) with the source-drain current of the storage transistor (Ts') of a non-programmable reference cell (Mr) of a construction identical to that of said storage cells (M), flowing in the input circuit thereof, in the circuit containing the input circuit of said reference read amplifier (Ar) and the source-drain line of said storage transistor (Ts') of said reference cell (Mr), there is arranged a first voltage source (Q1) whose voltage is adjustable in a step-by-step manner, and/or the gate electrode of said storage transistor (Ts') of said reference cell (Mr) is connected to the one terminal of a stepwisely adjustable second voltage source (Q2), and said reference read amplifier (Ar), said reference cell (Mr) and said stepwisely adjustable voltage sources (Q1, Q2) or one of said voltage sources (Q1, Q2) are/is integrated in the semiconductor body of said memory matrix (S) respectively.

2. An integrated memory matrix as claimed in claim 1, characterized in that at least one of said voltage sources (Q1, Q2) is a voltage divider composed of insulated-gate field-effect transistors (T11, T1, T12; T11', T1', T12') and integrated in the semiconductor body of the memory matrix, with said voltage divider comprising one base transistor each (T1, T1') and a number of load transistors (T11, T11'; T12, T12') gradated in their widths-to-length ratios (W/L) of the channel regions, with the source-drain lines of said load transistors capable of being switched to the conducting state in accordance with the chosen voltage value.

3. An integrated memory matrix as claimed in claim 2, characterized in that each of the gate electrodes of said load transistors (T11, T12; T11', T12') is connected to each time one output (11, 12, 13, 14) of a register (R) as integrated in the semiconductor body of the memory matrix, with said register (R) being adjustable via the outer terminals of the integrated memory matrix, and lockable via at least one additional outer terminal (Sv).

* * * * *